United States Patent
Yang et al.

(10) Patent No.: US 9,342,401 B2
(45) Date of Patent: May 17, 2016

(54) SELECTIVE IN-SITU RETOUCHING OF DATA IN NONVOLATILE MEMORY

(71) Applicant: SanDisk Technologies, Inc., Plano, TX (US)

(72) Inventors: Nian Yang, Mountain View, CA (US); Chris Avila, Saratoga, CA (US); Steven T. Sprouse, San Jose, CA (US); Aaron Lee, Mountain View, CA (US)

(73) Assignee: SanDisk Technologies Inc., Plano, TX (US)

( * ) Notice: Subject to any disclaimer, the term of this patent is extended or adjusted under 35 U.S.C. 154(b) by 37 days.

(21) Appl. No.: 14/028,260

(22) Filed: Sep. 16, 2013

(65) Prior Publication Data
US 2015/0082120 A1 Mar. 19, 2015

(51) Int. Cl.
G06F 11/10 (2006.01)
G11C 16/10 (2006.01)
G11C 11/56 (2006.01)
G11C 16/34 (2006.01)

(52) U.S. Cl.
CPC ........ *G06F 11/1048* (2013.01); *G11C 11/5628* (2013.01); *G11C 16/10* (2013.01); *G11C 16/3431* (2013.01); *G11C 16/3459* (2013.01)

(58) Field of Classification Search
CPC ........... G11C 16/3418; G11C 11/5628; G11C 16/3431; G11C 16/04; G11C 16/0483; G11C 16/10; G11C 16/3459; G06F 11/1072; G06F 11/1048; G06F 11/1068
USPC .................. 714/763, 764; 365/185.09, 185.22
See application file for complete search history.

(56) References Cited

U.S. PATENT DOCUMENTS

| | | | |
|---|---|---|---|
| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,365,486 | A | 11/1994 | Schreck |
| 5,570,315 | A | 10/1996 | Tanaka et al. |
| 5,657,332 | A * | 8/1997 | Auclair et al. ................. 714/763 |
| 5,661,053 | A | 8/1997 | Yuan |
| 5,768,102 | A | 6/1998 | Ma |

(Continued)

FOREIGN PATENT DOCUMENTS

| | | |
|---|---|---|
| JP | 2010-015665 | 1/2010 |
| WO | WO 9828748 | 7/1998 |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — James C Kerveros
(74) *Attorney, Agent, or Firm* — Davis Wright Tremaine LLP

(57) ABSTRACT

In a charge-storage memory array, memory cells that are programmed to a particular threshold voltage range and have subsequently lost charge have their threshold voltages restored by selectively adding charge to the memory cells. Adding charge only to memory cells with high threshold voltage ranges may sufficiently increase threshold voltages of other memory cells so that they do not require separate addition of charge.

22 Claims, 12 Drawing Sheets

(56) References Cited

U.S. PATENT DOCUMENTS

| | | | |
|---|---|---|---|
| 5,889,698 A | 3/1999 | Miwa et al. | |
| 5,903,495 A | 5/1999 | Takeuchi et al. | |
| 5,963,473 A * | 10/1999 | Norman | 365/185.02 |
| 6,011,725 A | 1/2000 | Eitan | |
| 6,046,935 A | 4/2000 | Takeuchi et al. | |
| 6,178,117 B1 | 1/2001 | Cleveland | |
| 6,222,762 B1 | 4/2001 | Guterman et al. | |
| 6,856,568 B1 | 2/2005 | Wong | |
| 7,079,422 B1 | 7/2006 | Wong | |
| 7,099,196 B2 * | 8/2006 | Suh | G11C 16/3454 365/185.19 |
| 7,594,157 B2 * | 9/2009 | Choi et al. | 714/764 |
| 7,945,825 B2 * | 5/2011 | Cohen et al. | 714/721 |
| 8,261,136 B2 | 9/2012 | D'Abreu et al. | |
| 8,281,061 B2 * | 10/2012 | Radke et al. | 711/103 |
| 8,365,030 B1 * | 1/2013 | Choi et al. | 714/746 |
| 8,374,028 B2 * | 2/2013 | Zhao et al. | 365/185.03 |
| 8,422,305 B2 * | 4/2013 | Lee | 365/185.22 |
| 8,553,461 B2 * | 10/2013 | Moschiano | G11C 11/5628 365/185.18 |
| 8,611,150 B2 * | 12/2013 | Shin | G11C 11/5642 365/185.03 |
| 8,689,082 B2 * | 4/2014 | Oh et al. | 714/773 |
| 8,804,422 B2 * | 8/2014 | Chung | G11C 16/10 365/185.03 |
| 8,839,071 B2 * | 9/2014 | Jo | 714/763 |
| 8,879,318 B2 * | 11/2014 | Ahn | G11C 16/0483 365/185.03 |
| 8,879,329 B2 * | 11/2014 | Moschiano et al. | 365/185.22 |
| 8,938,655 B2 * | 1/2015 | Hamilton et al. | 714/763 |
| 2002/0145916 A1 | 10/2002 | Chevallier | |
| 2004/0047195 A1 | 3/2004 | Guterman et al. | |
| 2007/0263454 A1 | 11/2007 | Cornwall et al. | |
| 2008/0055990 A1 | 3/2008 | Ishikawa et al. | |
| 2008/0239808 A1 | 10/2008 | Lin | |
| 2009/0147581 A1 | 6/2009 | Isobe | |
| 2009/0161466 A1 | 6/2009 | Hamilton et al. | |
| 2009/0198879 A1 | 8/2009 | Tanaka | |
| 2009/0327581 A1 | 12/2009 | Coulson | |
| 2010/0165689 A1 | 7/2010 | Rotbard et al. | |
| 2010/0195393 A1 | 8/2010 | Eggleston | |
| 2010/0217919 A1 | 8/2010 | Sukegawa et al. | |
| 2011/0302477 A1 | 12/2011 | Goss et al. | |
| 2012/0220088 A1 | 8/2012 | Alsmeier | |
| 2012/0271982 A1 | 10/2012 | Callaghan | |
| 2012/0294092 A1 * | 11/2012 | Cho | G11C 11/406 365/185.22 |
| 2013/0039130 A1 * | 2/2013 | Lee | G11C 11/5628 365/185.19 |
| 2013/0107628 A1 | 5/2013 | Dong et al. | |

FOREIGN PATENT DOCUMENTS

| | | |
|---|---|---|
| WO | WO 2009012204 | 1/2009 |
| WO | WO 2009145923 | 12/2009 |

OTHER PUBLICATIONS

Technical Search Report, Oct. 16, 2012, 12 pages.

* cited by examiner

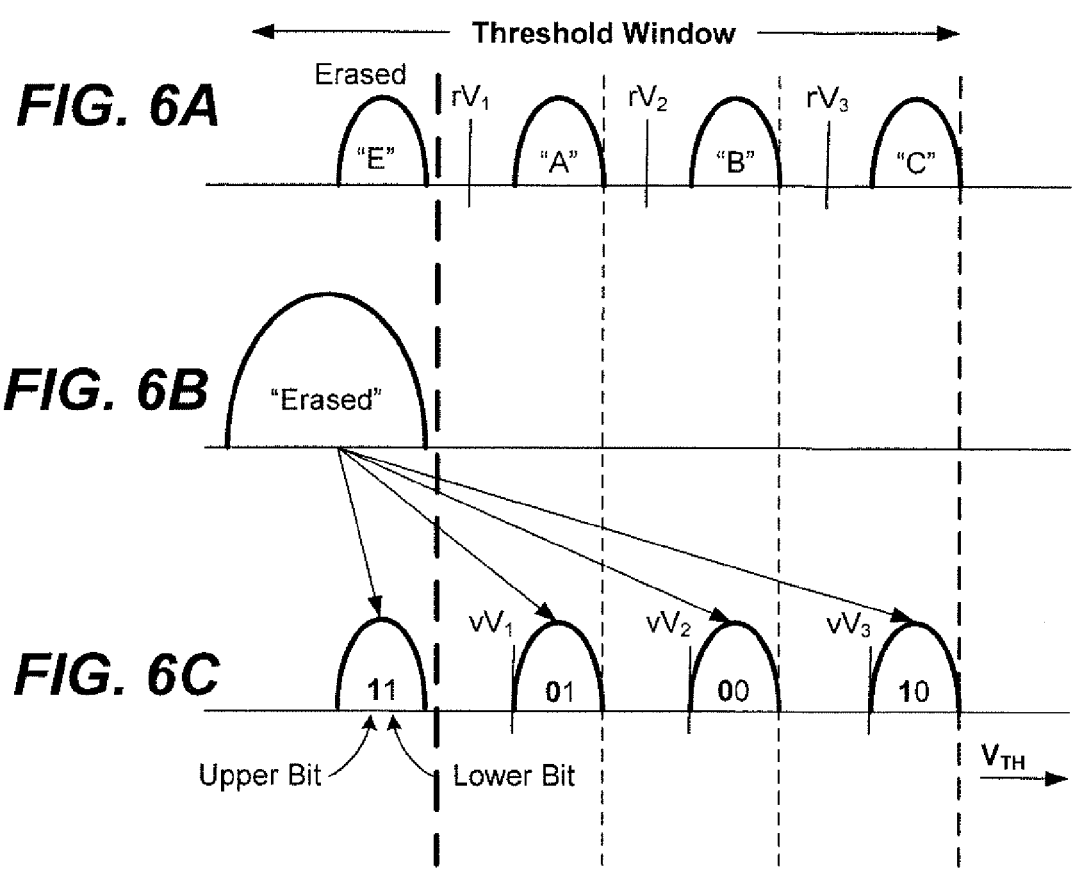

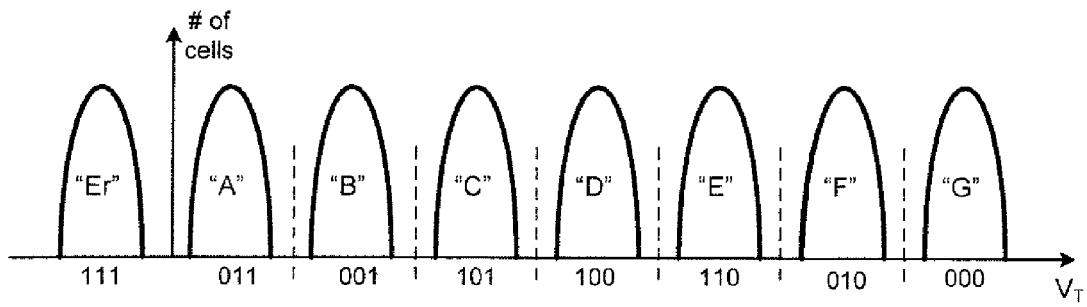
FIG. 7A
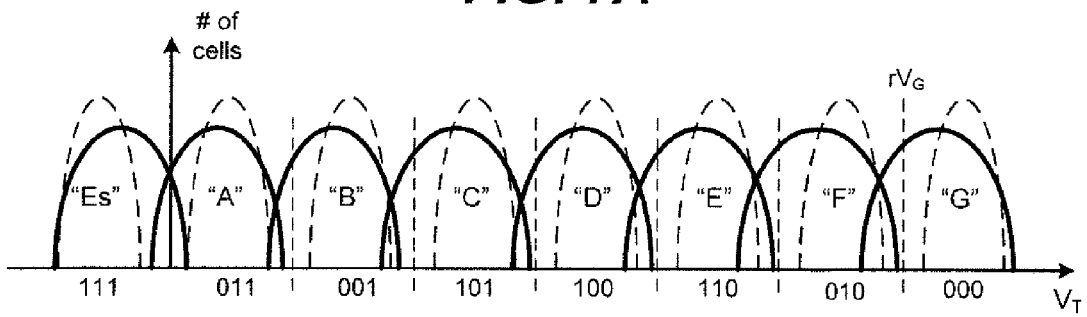
FIG. 7B
| Original logic state | 111 | 011 | 001 | 101 | 100 | 110 | 010 | 000 |
|---|---|---|---|---|---|---|---|---|
| Next logic state down |  | 111 | 011 | 001 | 101 | 100 | 110 | 010 |
| Next logic state up | 011 | 001 | 101 | 100 | 110 | 010 | 000 |  |
FIG. 7C

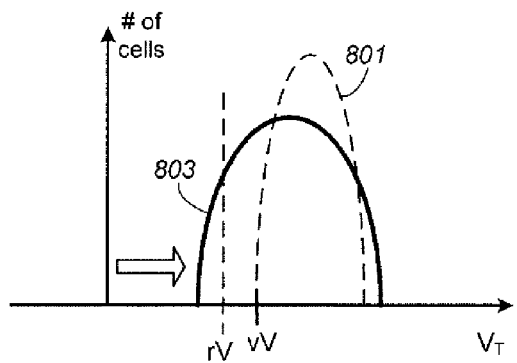
FIG. 8
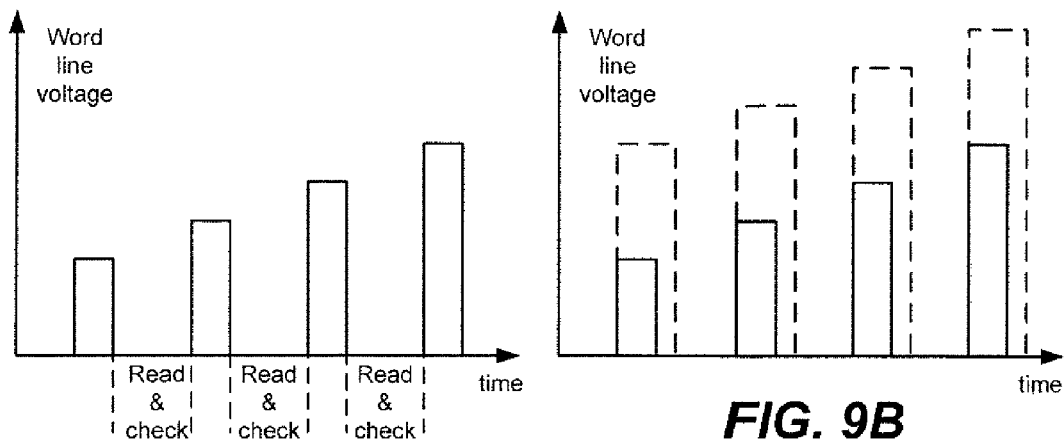
FIG. 9A
FIG. 9B
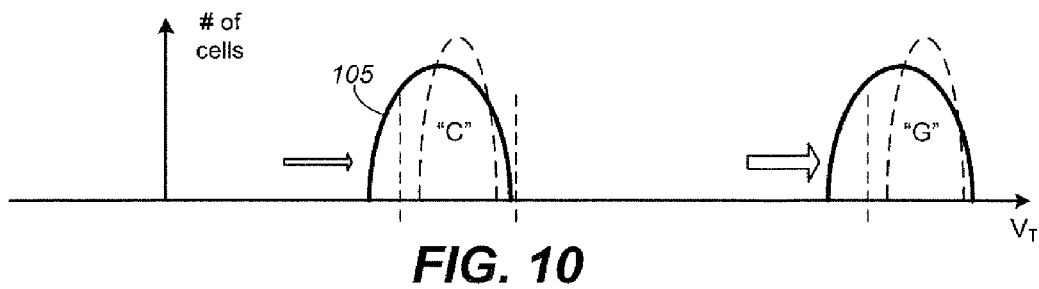
FIG. 10

SELECTIVE IN-SITU RETOUCHING OF DATA IN NONVOLATILE MEMORY

BACKGROUND

This application relates to the operation of re-programmable non-volatile charge-storage memory systems such as semiconductor flash memory that suffer from data disturbance due to loss of charge from charge storage elements of some memory cells, and more specifically to methods of maintaining data in such memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In some cases, the amount of charge stored in a charge-storage memory cell may change over time, which may affect the data when it is read from the memory array. In particular, charge may leak from memory cells causing misreading of data stored in those cells. It is desirable to manage a memory array so that data can be correctly read and to perform such management in an efficient manner.

SUMMARY OF THE INVENTION

When data that is stored in a charge-storage memory array becomes disturbed and is found to contain a significant number of bad bits, a memory system may determine that bad bits are caused by dropping threshold voltage (e.g. due to charge leakage). In response, a retouching operation may increase threshold voltages of memory cells containing bad bits without copying the data to another location, thus saving time, energy, and space. Retouching may be limited to memory cells containing bad bits, or to memory cells programmed to a particular memory state, or to only memory cells programmed to a particular memory state that are misread as being in a memory state that has a threshold voltage range immediately below the threshold voltage range of the programmed memory state. Retouching may use small voltage pulses (smaller than regular programming), with data being read and checked between pulses. Checking may be by full ECC decoding, or by comparing the read data with ECC corrected data.

An example of a method of operating a nonvolatile memory array includes: identifying a group of memory cells that were initially programmed to target threshold voltage ranges and verified as being in the target threshold voltage ranges using a cell programming operation, the group of memory cells containing a significant number of bad bits; and subsequently, applying a cell retouching operation to increase threshold voltages of memory cells of the identified group back to their target threshold voltage ranges, without erasing the memory cells of the identified group, the cell retouching operation may include; (a) applying a programming pulse to memory cells of the identified group; (b) subsequently reading the memory cells; (c) subsequently applying Error Correction Code (ECC) decoding of data read from the memory cells; (d) subsequently comparing a number of bad bits found from the ECC decoding with a threshold number to determine if retouching is complete; and (e) if the number of bad bits found from the ECC decoding exceeds the threshold number, then initiating another cycle of steps (a)-(e).

If the number of bad bits found from the ECC decoding does not exceed the threshold number, then the retouching operation may terminate. A first cycle of the retouching operation may apply a programming pulse of a lower voltage than any normal programming pulse of the regular cell programming operation. The programming pulse may be applied only to memory cells of the identified group that are identified as containing bad bits. The nonvolatile memory array may be a Multi Level Cell (MLC) memory array and the programming pulse may be applied only to memory cells with threshold voltages corresponding to one of at least four memory states. That memory state may have a threshold voltage range that is higher than threshold voltage ranges of any others of the at least four memory states. The cell retouching operation may start with memory cells that are programmed to a memory state with the highest corresponding threshold voltage range of any memory state. The cell retouching operation may subsequently proceed to memory cells that are programmed to a memory state with the second highest corresponding threshold voltage range of any memory state. The group of memory cells may be identified as having a significant number of memory cells with threshold voltages lower than their target threshold voltage ranges as identified by the ECC decoding. The ECC decoding may be performed as part of a check of previously programmed data. The check may be triggered by either: (1) an elapsed time since the group of memory cells was initially programmed, (2) a number of writes and/or reads within a block containing the group of memory cells since the group of memory cells were initially programmed, or (3) a high ECC error rate found in data stored near the group of memory cells. The cell retouching may apply the programming pulse to all memory cells of the identified group that are not in the erased state.

An example of a nonvolatile memory system includes: an array of charge storage memory cells; a reading circuit that is configured to read a plurality of data bits from a portion of the array of charge storage memory cells; an Error Correction Code (ECC) circuit that is configured to receive the plurality of data bits from the reading circuit and to identify a number of bad bits in the plurality of data bits; and a data retouching circuit that is configured to increase threshold voltages of charge storage memory cells containing bad bits, without erasing the charge storage memory cells, until the number of bad bits identified by the ECC circuit drops below a threshold number. The data retouching circuit may be configured to increase threshold voltages of all memory cells in the portion of the memory array that are not in the erased state. The data retouching circuit may be configured to increase threshold voltages of charge storage memory cells using programming pulses that are smaller than normal programming pulses used in programming erased cells. The reading circuit may be configured to read the plurality of bits using a read voltage that is different to a default read voltage that is used in a read operation in response to a host read command. The array of charge storage memory cells may be a Multi Level Cell (MLC) array with each memory cell storing two or more bits of data. A data programming circuit may program new data to an erased portion of the array of charge storage memory cells using voltage pulses of a higher voltage than voltage pulses used by the data retouching circuit.

An example of a method of operating a nonvolatile memory array includes: programming a plurality of memory cells with data; subsequently maintaining the data in the plurality of memory cells over a period of operation of the nonvolatile memory array; and subsequently applying a cell retouching operation to increase threshold voltages of memory cells, without erasing the plurality of memory cells, the cell retouching operation comprising one or more cycles, each cycle including: (a) reading the plurality of memory cells; (b) subsequently applying Error Correction Code (ECC) decoding of data read from the plurality of memory cells to identify bad bits; (c) subsequently comparing a number of bad bits found from the ECC decoding with a threshold number to determine if retouching is complete; (d) if the number of bad bits found from the ECC decoding exceeds the threshold number, then applying a retouch voltage pulse to a subset of the plurality of memory cells.

The subset of the plurality of memory cells may consist of all memory cells with threshold voltages in a predetermined threshold voltage range. The predetermined threshold voltage range may correspond to one or more programmed memory states. The retouch voltage pulse may be smaller in amplitude and/or width than a programming voltage pulse. Cell retouching may be triggered by: an elapsed period of time since the programming of the plurality of memory cells with data, a number of access operations directed to a block containing the plurality of memory cells, or a number of errors found in other data stored in the block containing the plurality of memory cells.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of 4-state memory cells.

FIGS. 7A-7C illustrate how change in charge levels of cells may affect data.

FIG. 8 shows how the threshold voltage of a memory cell may be returned to an appropriate range.

FIG. 9A shows an example of how voltage pulses are applied to a word line to return memory cells to their desired range.

FIG. 9B shows a comparison of voltage pulses used for retouching and voltage pulses used for regular programming.

FIG. 10 illustrates the effects that retouching memory cells programmed to a particular logic state may have on other memory cells that were programmed to different logic states.

DETAILED DESCRIPTION

Memory System

Figure 1:
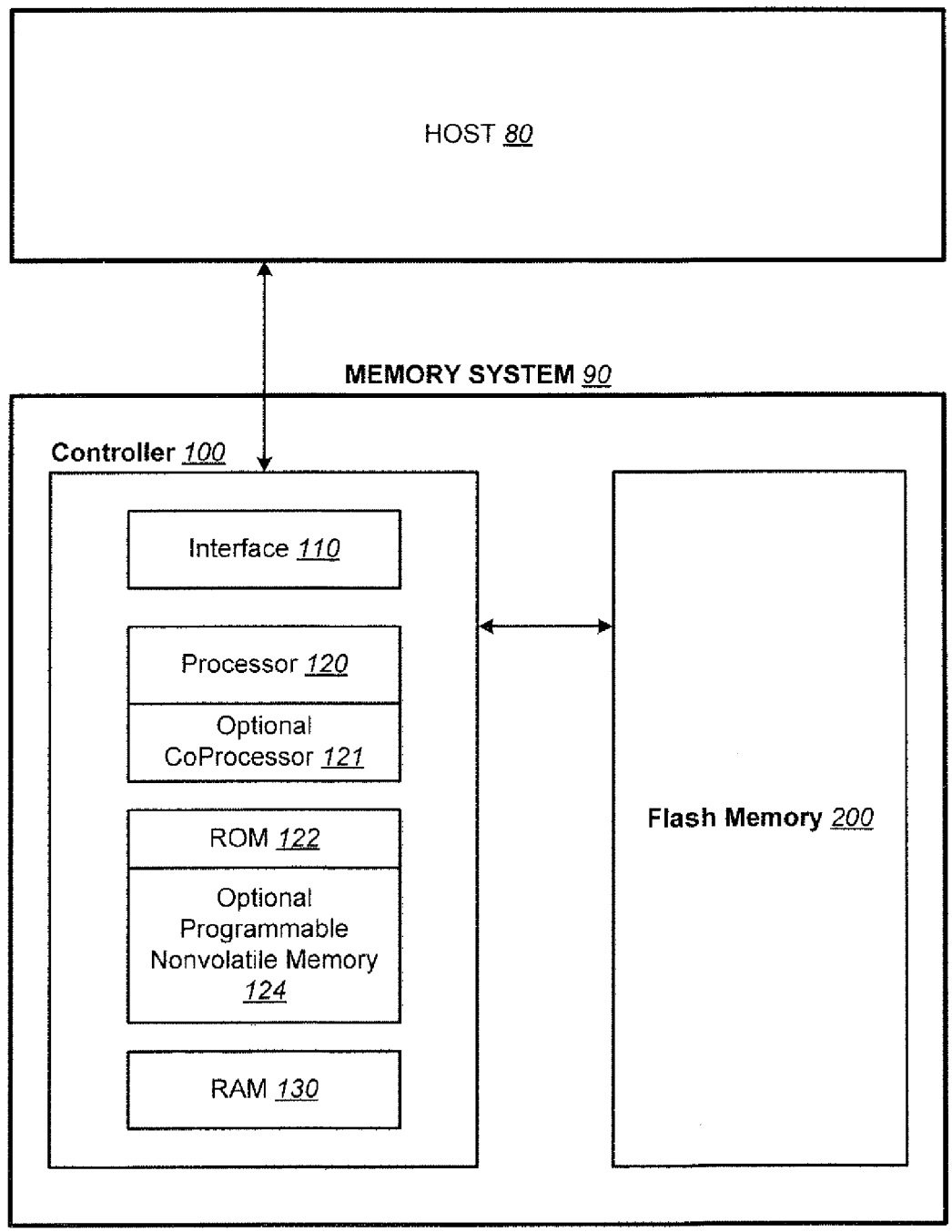
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits, a processor, ROM (read-only-memory), RAM (random access memory), programmable nonvolatile memory, and additional components. The controller is typically formed as an ASIC (application specific integrated circuit) and the components included in such an ASIC generally depend on the particular application.

Physical Memory Structure

Figure 2:
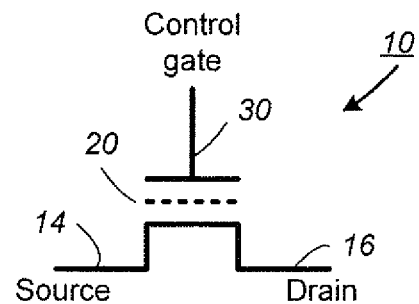
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
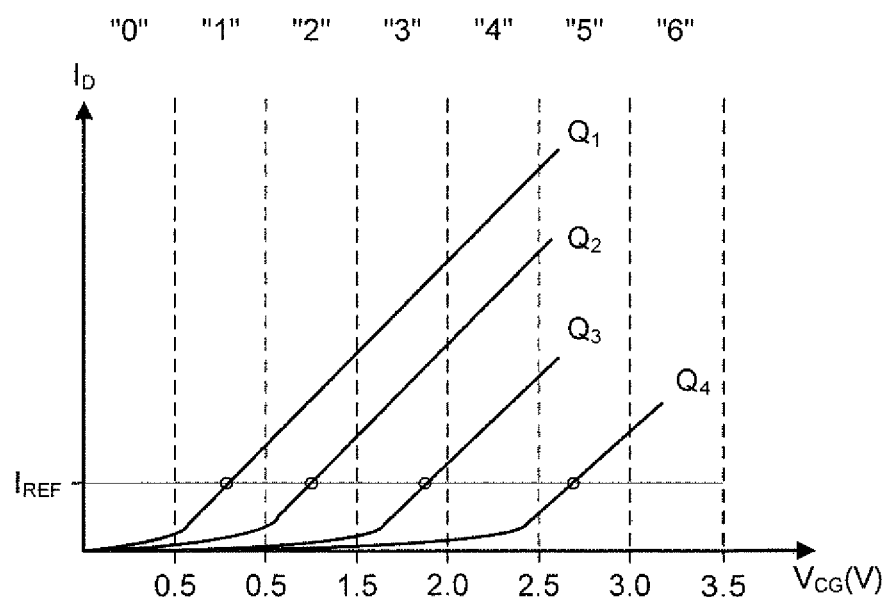
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in intervals of 0.5V each. For example, if a reference current, IREF of 2 gA is used as shown, then the cell programmed with Q1 may be considered to be in a memory state "1" since its curve intersects with $T_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
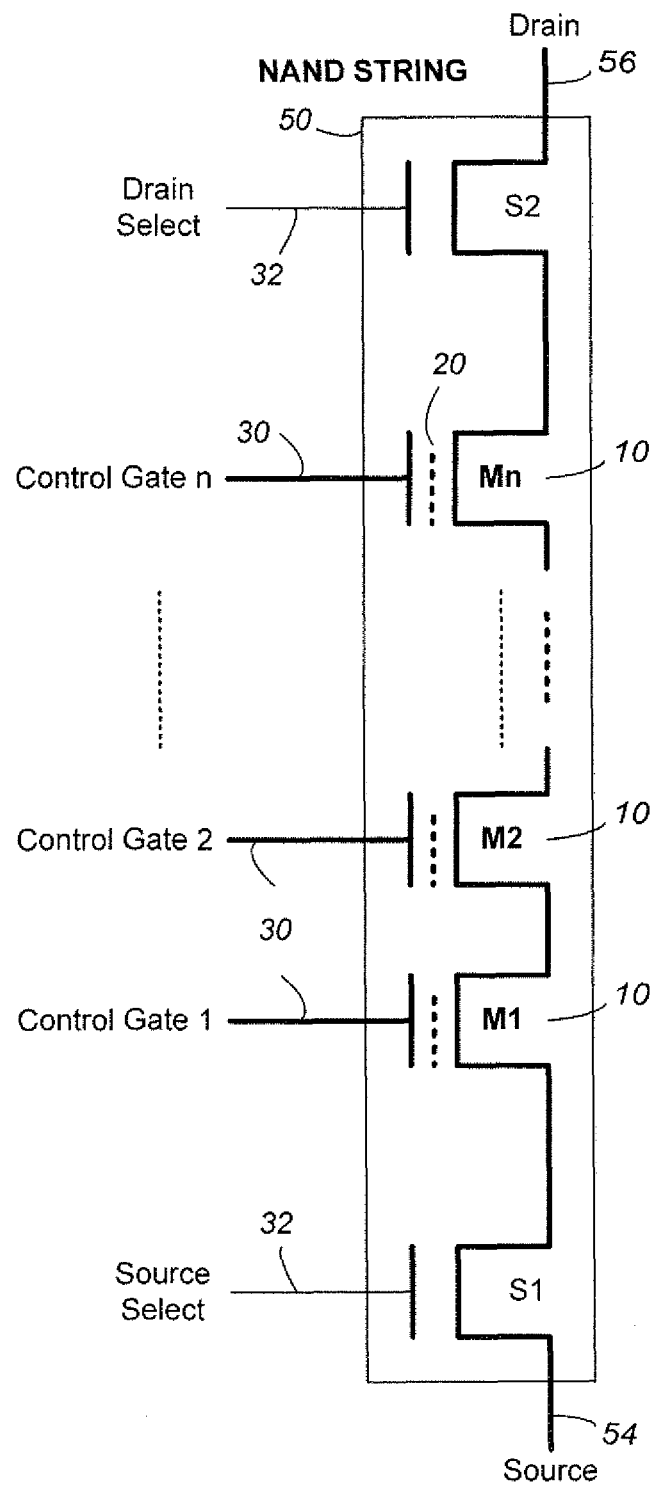
FIG. 4A illustrates schematically a string of memory cells organized into a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
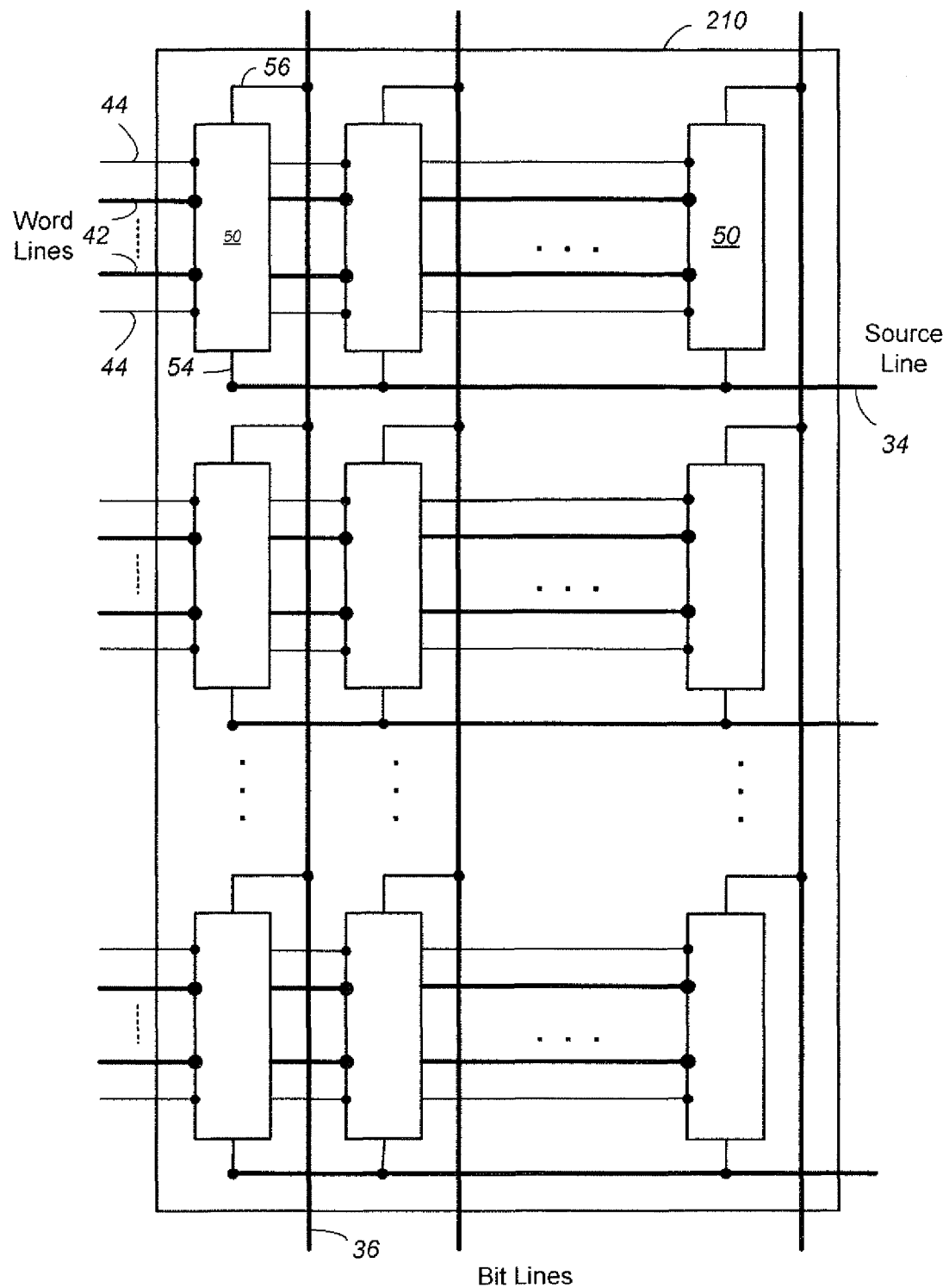
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
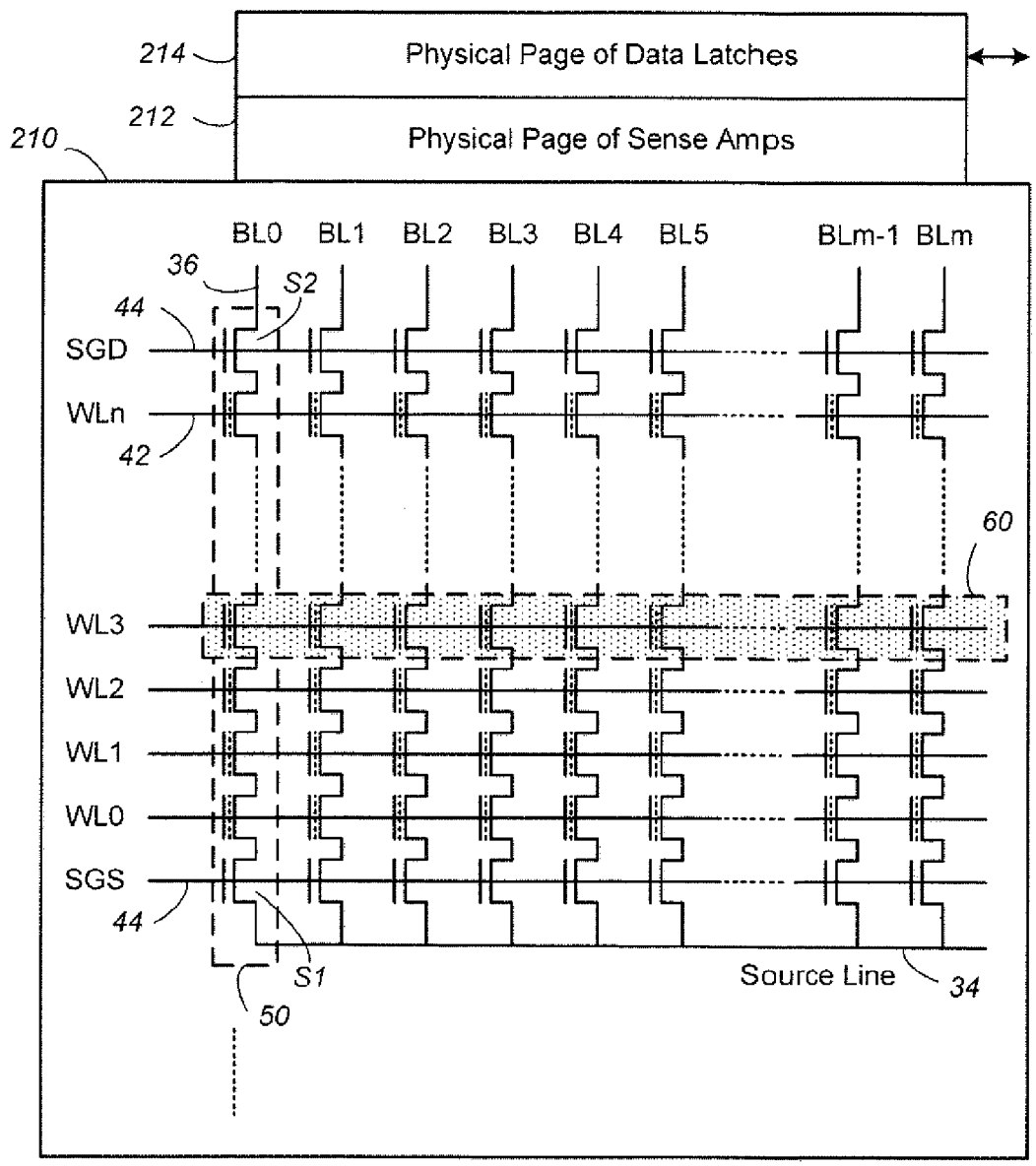
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

An alternative arrangement to a conventional two-dimensional (2-D) NAND array is a three-dimensional (3-D) array. In contrast to 2-D NAND arrays, which are fowled along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety. In general, operation of 3-D NAND arrays is similar to operation of 2-D NAND arrays and 3-D NAND arrays may be operated as SLC or MLC memories.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6A illustrates the initial distribution of "erased" threshold voltages for an erased memory. FIG. 6B illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" or "E" state. As the memory gets more programming, the initial distribution of the "erased" state as shown in FIG. 6A will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three subpasses respectively.

Disturbance of Stored Data

Ideally, once a memory cell is programmed to a particular threshold voltage it maintains that threshold voltage until it is erased so that the memory cell can be correctly read. However, in real memory cells, charge may leak from a charge storage element such as a floating gate, or charge may leak into the charge storage element (e.g. during programming of nearby memory cells). In some cases, such changes in threshold voltage are sufficient to cause memory cells to be misread.

In some cases, in order to maintain data in a readable condition when there is significant disturbance, the data may be scrubbed or refreshed by reading out the data, correcting the data by ECC, and then writing the corrected data in another location, generally in another block. The original (disturbed) data may then be marked as obsolete. The block containing the obsolete version may subsequently be erased so that the block can be reused.

According to an embodiment of the present invention, stored data may be subject to a retouching operation after it has been stored for some time and may have become disturbed. A retouching operation does not copy the data to another location in the nonvolatile memory but instead performs some relatively small adjustment of the data in-situ. In particular, threshold voltages of memory cells that have dropped may be restored to an appropriate range by applying voltage pulses that are similar to programming voltage pulses.

FIG. 7A shows an example of an eight-state MLC memory in which each memory cell can be in either the erased "Er" state, or one of seven programmed states A-G. This eight-state arrangement allows three bits of data to be stored in each memory cell (three logical pages of data per physical page of memory cells). A corresponding three-bit value is given for each memory state in FIG. 7A, starting with 111 for the erased state and ending with 000 for the highest state (G state). It will be understood that the assignment of logical bits to memory states may be done in any suitable manner and FIG. 7A simply illustrates one example.

FIG. 7B illustrates how data may become disturbed over time. Original programmed distributions (see FIG. 7A) are shown by dashed lines with disturbed distributions shown by solid lines. It can be seen that while original distributions are separated and can be clearly distinguished by reading using appropriate discrimination voltages (as indicated by dashed lines), disturbed distributions are not separated and overlap to some extent. Reading the memory cells using the discrimination voltages shown will not provide accurate results because of this overlap. For example, a significant number of memory cells that were originally in the G state would be read as being in the F state when read using $rV_G$ because the disturbed distribution for state G extends down below $rV_G$. Such misreading would cause a memory cell that was programmed with bits 000 to be read as storing 010. Thus, one bad bit would be read.

FIG. 7C illustrates disturbance of three-bit logic states of FIG. 7A to either lower logic states (lower in terms of threshold voltage range) or to higher logic states (higher in terms of threshold voltage range). Disturbance may cause a memory cell in any state, except the erased state, to be read as being in a lower state. (Because there is no memory state lower than the erased state such a misreading does not occur for memory cells in the erased state.) Similarly, disturbance may cause a memory cell in any state, except the highest state (the G state in this example) to be read as being in a higher state. In many charge-storage memories, charge leakage is significant so that memory cells tend to have lower threshold voltages than their programmed threshold voltages. Lower threshold voltages may be the main source of bad bits with higher threshold voltages causing few or no bad bits. Aspects of the present invention address such lower threshold voltages.

A pattern of lower threshold voltages may be observed when memory cells are read. When data is read from a memory array the data may be sent to an Error Correction Code (ECC) decoder that identifies bad bits and may correct the bad bits. Bad bits may be checked to see if they are the result of misreading caused by a cell threshold voltage that is lower than programmed. For example, cells in the 000 state being misread as being in the 010 state may be the result of such reduced threshold voltage. Such identification may require reading multiple logical pages stored in a physical page of memory cells and analyzing the logical pages together. The number of bad bits caused by reduced threshold voltage may be compared to the total number of bad bits to see if reduced threshold is a major cause of bad bits (e.g. causing more than 50% of bad bits, or more than 75%, or some other percentage). If reduced threshold voltage is a major cause of bad bits then the data may be suitable for data retouching.

FIG. 8 shows an example of how retouching may be applied to memory cells programmed to a particular memory state. For example, the memory state may be any of the programmed memory states A-G shown in FIG. 7A. The original distribution 801 of memory cells has become disturbed so that the disturbed distribution 803 extends below the read voltage, rV, for this memory state. A retouching operation pushes the distribution back above rV, back to the verification voltage, vV, that was originally used to program the cells. In particular, a series of voltage pulses may be applied along a selected word line where the disturbed memory cells are located while bit lines serving the disturbed memory cells are selected (and other bit lines are inhibited).

FIG. 9A shows an example of a series of pulses of increasing voltage being applied to a word line in a retouching operation. After each pulse, the data from the word line is read and checked. Only if the read data does not pass this check is a subsequent pulse applied. This check may include checking the read data against ECC-corrected data (e.g. XORing the read data and the corrected data to determine if the read data is correct, or near correct). Checking may include sending the read data to an ECC decoder where it is decoded to determine whether the number of bad bits has reached an acceptable level.

While FIG. 9A shows a series of pulses that may be considered similar to programming pulses, retouching pulses may be smaller than normal programming pulses because only small changes in threshold voltage are desired and it is desirable to keep disturbance to a minimum. FIG. 9B shows both retouching voltage pulses (solid lines) and normal programming pulses (dashed lines). Retouching pulses may have smaller voltages than voltage pulses used in normal programming and/or may be of shorter duration. FIG. 9B shows retouching pulses that are both smaller in voltage and of shorter duration than normal programming pulses.

In some cases, retouching is directed only to memory cells in particular memory states. For example, memory states with higher corresponding threshold voltages (e.g. G state in FIG. 7A) may be retouched first. In some cases, this may provide all the retouching needed because such a retouching operation may affect other cells also, even though the other cells may be inhibited throughout the retouching operation.

FIG. 10 shows an example where retouching is applied only to memory cells in the highest memory state (memory state with the highest threshold voltage range), the G state. While all other memory cells are inhibited during this retouching operation, they may still be affected. For example, FIG. 10 shows memory cells in state C having a disturbed distribution 105 that may be shifted upwards by retouching cells in the G state. While memory cells in the C state are inhibited throughout the retouching operation, the cells are nevertheless affected and have some increase in threshold voltage. Similar increases in threshold voltages may be experienced by memory cells in other lower states (A, B, and D-F) while retouching the cells in the G state. While these increases may be relatively small they may be sufficient push some memory cells back to their correct memory states from a lower state (i.e. return their threshold voltages above their read voltage). Thus, retouching memory cells at higher threshold voltages may not only correct bad bits caused by misreading the memory cells with higher threshold voltages (e.g. G state) but may also correct some bad bits caused by misreading memory cells with lower threshold voltages (e.g. C state).

The effects of retouching on unselected cells may be caused by some weak programming effect (i.e. cells that are inhibited by raising channel voltage may not be perfectly inhibited so that some charge is added to charge storage elements of such inhibited memory cells). Also increasing charge stored in a memory cell may affect threshold voltages of neighboring cells so that retouching memory cells programmed to higher memory states may affect neighboring cells that were programmed to lower memory states. While such effects are not limited to memory cells with bad bits, the result may be a decrease in bad bits, particularly where lower threshold voltage is a major source of bad bits. Some unselected memory cells may have their threshold voltage increased during retouching in a manner that causes misreading (i.e. increased to a threshold voltage corresponding to a higher memory state). In many cases, fewer bad bits are caused by shifting such unselected memory cells up to a higher memory state than the number of bad bits corrected by shifting unselected cells with bad bits back to their correct memory states. Thus, the net effect is a reduction in bad bits.

Figure 11:
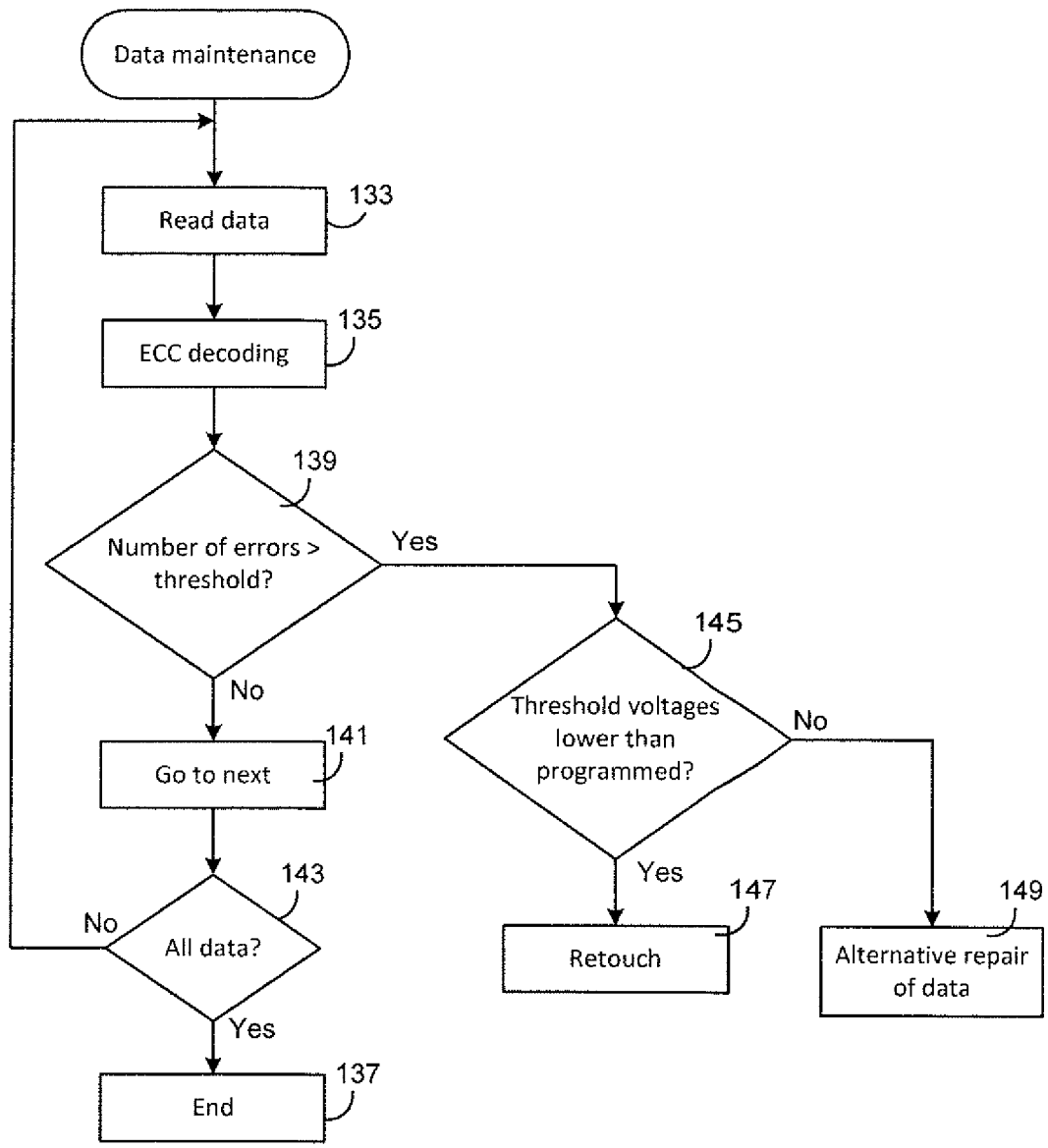
FIG. 11 illustrates a data maintenance scheme that may trigger retouching.

FIG. 11 shows an example of a data maintenance scheme that maintains data stored in a charge-storage memory array. For example, the operation shown in FIG. 11 may be applied on a periodic basis to stored data, or may be triggered by some event. In general, data tends to become disturbed over time because of charge leakage, and also as a result of voltages applied when accessing the data (reading the data), or accessing nearby areas of the memory (e.g. programming or reading nearby data, or erasing nearby blocks).

Data is first read 133 from one or more pages of the memory array and is then decoded 135 using ECC decoding to determine a number of errors (bad bits) in the data. The number of errors is compared with a predetermined threshold number 139. If the number of errors is not greater than the threshold number then the operation moves on to the next data 141 (e.g. next page or group of pages). If all of the data to be maintained in the present operation has already been maintained 143 (i.e. there is no further data to maintain in this operation) then the operation ends 137. If there is further data to maintain 143 then the operation loops back and repeats the operation for subsequent data. If the number of errors is greater than the threshold 139 then a determination is made as to whether threshold voltages lower than their programmed levels is a major cause of bad bits 145. For example, ECC decoding may identify which bits are bad, and this information, in combination with the mapping of states shown in FIG. 7C allows bad bits to be identified as being caused by reading a memory cell as being in the next memory state down from its programmed memory state. If this is a significant cause of bad bits then the data is retouched 147. If lower threshold voltage is not a significant source of bad bits then data may be repaired in an alternative manner 149. For example, a corrected copy of the data (corrected by ECC) may be written in another location and the original copy may be marked as obsolete.

Figure 12:
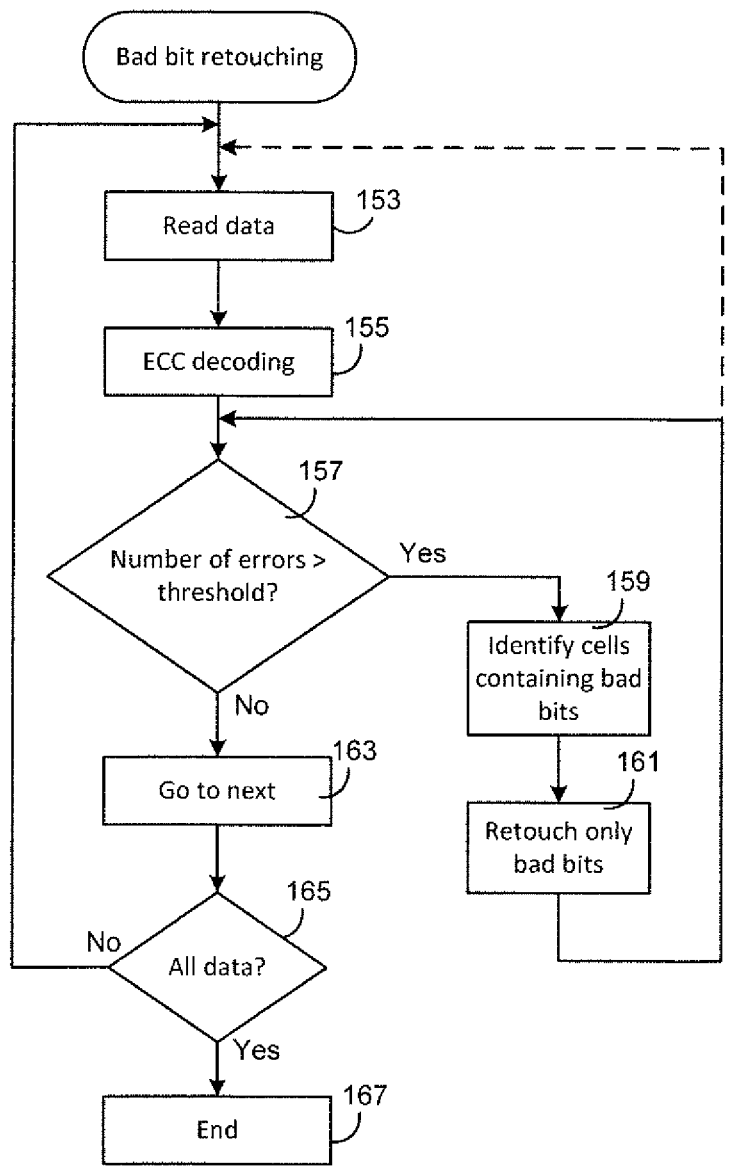
FIG. 12 illustrates a retouching operation.

FIG. 12 shows an example of a retouching operation that retouches bad bits in data without moving the data (i.e. retouches the data in-situ). The data is read 153 and decoded 155 using ECC. Then, if the number of errors exceeds a threshold number 157, the cells containing bad bits are identified 159. In particular, cells that were misread because of a shift down in threshold voltage are identified, for example by identifying memory cells that were read as being in the next logic state down from their programmed state (e.g. as illustrated in FIG. 7C). Then, only these cells are selected during a retouching operation 161. These cells may receive a relatively low voltage on their bit lines to allow programming, while other unselected cells receive a relatively high voltage on their bit lines to inhibit programming, when a voltage pulse is applied on a word line. Subsequently, the number of errors in the data may again be compared with a threshold number (as shown by solid line). The number of errors may be obtained by checking if bad bits have flipped. Alternatively, the data may be read and ECC decoded again to determine if the number of errors is still above the threshold number (as shown by dashed line). Once the number of errors is not above the threshold 157, the operation moves on to the next data 163 and loops back 165 until all data to be retouched has been retouched. The operation then terminates 167.

Figure 13:
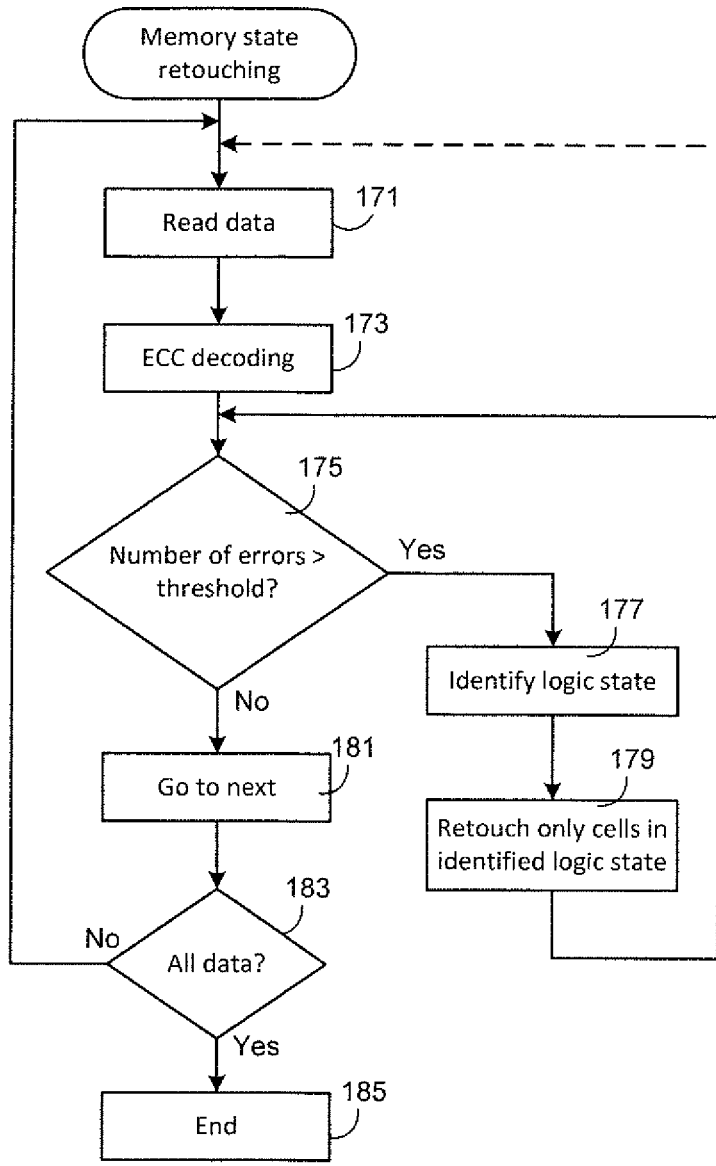
FIG. 13 illustrates another retouching operation.

FIG. 13 shows another example of a retouching operation that retouches only memory cells that were programmed to a particular memory state. Data is read 171 and decoded by ECC 173. The number of bad bits found by ECC is compared to a threshold number 175. If the number of bad bits exceeds the threshold number then the programmed logic states of the memory cells being misread are determined. If a particular logic state is found to be the source of a significant number of errors then that logic state may be identified as a subject for retouching 177. For example, if more than some percentage of bad bits (e.g. 20%, 50%, or some other amount) are caused by misreading memory cells that were programmed to the G state as being in the F state, then logic state G may be identified as the subject of retouching. Only memory cells that were programmed to the identified logic state (G state) are retouched 179. This may mean retouching all memory cells that were programmed to the G state (both cells being misread and those being correctly read). Alternatively, the scheme may focus only on memory cells that were programmed to the G state and that are now being misread causing bad bits. Retouching is performed on the identified memory cells as before. The operation then compares the number of bad bits with the threshold number 175 again to determine if more retouching is needed.

If the number of errors is still above the threshold number 175, then a logic state is again identified 177. However, this may not be the same logic state as before. For example, where the G state was subject to retouching, cells that were misread may now be correctly read as being in the G state so that memory cells programmed to the G state no longer provide a large percentage of bad bits. Another logic state may be identified and memory cells that were programmed to that logic state may be retouched. As previously described, such retouching of memory cells programmed to particular memory states may tend to correct bad bits in other cells too.

If the number of errors is not above the threshold number, then the operation goes on to the next data 181, and if all data to be retouched has been retouched 183, then the operation ends 185.

In another embodiment, rather than determine the amount of errors associated with particular logic states, the operation simply starts with the highest memory state and progresses downwards in order of threshold voltage. In general, the higher states are more likely to be disturbed so that this order may coincide with the order of decreasing errors per state. By starting with the highest memory states, the effects on lower states may be sufficient so that it may not be necessary to continue down through all memory states. That is, by retouching memory cells programmed to the higher memory states, memory cells programmed to lower memory states may be returned to their correct states so that they do not need to be retouched.

Figure 14:
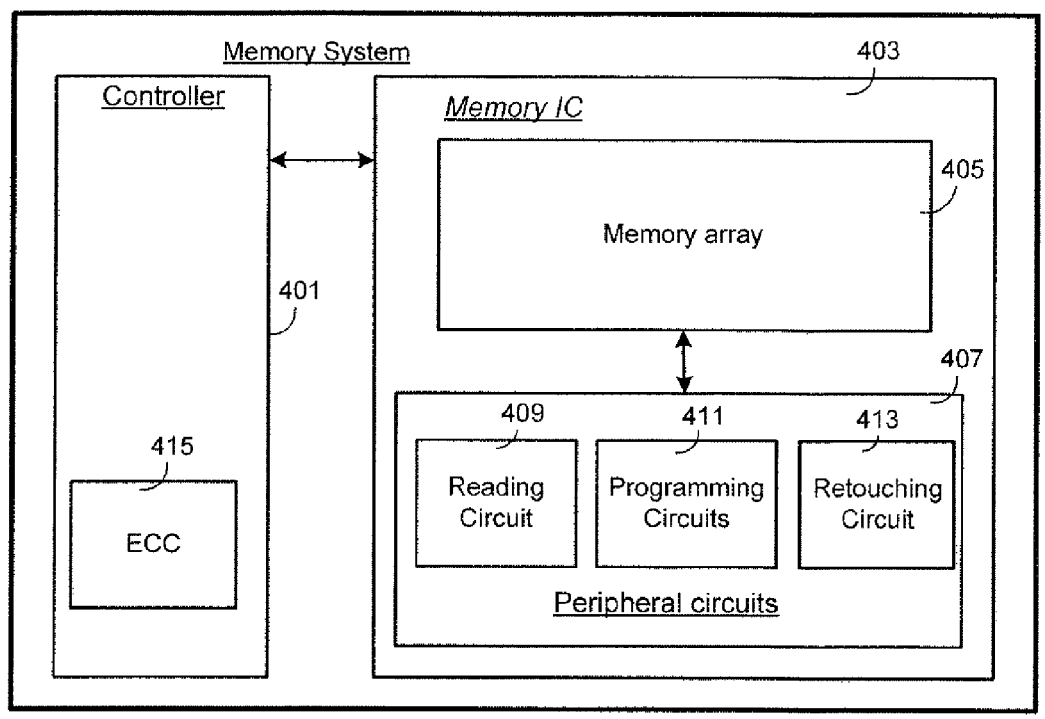
FIG. 14 illustrates an example of memory system hardware.

FIG. 14 shows an example of hardware that may be used to implement aspects of the present invention. In particular, FIG. 14 shows a memory system that includes a memory controller 401 and a memory IC 403. The memory IC 403 includes a memory array 405, which may be a planar NAND array, 3-D NAND memory array, or any other suitable charge storage memory array. Peripheral circuits 407 are provided on the memory IC, including reading circuits 409, programming circuits 411, and retouching circuits 413. These circuits are not necessarily exclusive and may share certain components. The controller 401 includes ECC circuits 415 for encoding and decoding data. In particular, the ECC circuits 415 can identify a number of bad bits in data that is read out from the memory array so that retouching circuits can retouch memory cells containing those bad bits.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a nonvolatile memory array comprising:

identifying a group of memory cells initially programmed to target threshold voltage ranges and initially verified as being in the target threshold voltage ranges using a cell programming operation, the group of memory cells containing a significant number of bad bits; and subsequently, applying a cell retouching operation to increase threshold voltages of memory cells of the identified group back to their target threshold voltage ranges, without erasing the memory cells of the identified group, the cell retouching operation comprising:

applying a programming pulse to memory cells of the identified group;

subsequently reading the memory cells;

subsequently applying Error Correction Code (ECC) decoding of data read from the memory cells;

subsequently comparing a number of bad bits found from the ECC decoding with a threshold number to determine if retouching is complete;

if the number of bad bits found from the ECC decoding exceeds the threshold number, then initiating another retouching operation; and wherein one or more retouching operations apply a programming pulse of a lower voltage than any normal programming pulse of the regular cell programming operation.

2. The method of claim 1 wherein, if the number of bad bits found from the ECC decoding does not exceed the threshold number, then terminating the retouching operation.

3. The method of claim 1 wherein a first cycle of the retouching operation applies a programming pulse that is narrower than any normal programming pulse of the regular cell programming operation.

4. The method of claim 1 wherein the programming pulse is applied only to individual memory cells of the identified group that contain bad bits.

5. The method of claim 4 wherein the nonvolatile memory array is a Multi Level Cell (MLC) memory array and the programming pulse is applied only to memory cells with threshold voltages corresponding to one of at least four memory states.

6. The method of claim 5 wherein the one of the at least four memory states has a threshold voltage range that is higher than threshold voltage ranges of any others of the at least four memory states.

7. The method of claim 1 wherein the cell retouching operation starts with memory cells that are programmed to a memory state with the highest corresponding threshold voltage range of any memory state.

8. The method of claim 7 wherein the cell retouching operation subsequently proceeds to memory cells that are programmed to a memory state with the second highest corresponding threshold voltage range of any memory state.

9. The method of claim 1 wherein the group of memory cells is identified by ECC decoding.

10. The method of claim 9 wherein the ECC decoding is performed as part of a check of previously programmed data.

11. The method of claim 10 wherein the check is triggered by either: (1) an elapsed time since the group of memory cells was initially programmed, (2) a number of writes and/or reads within a block containing the group of memory cells since the group of memory cells were initially programmed, or (3) a high ECC error rate found in data stored near the group of memory cells.

12. The method of claim 11 wherein the cell retouching applies the programming pulse to all memory cells of the identified group that are not in the erased state.

13. A nonvolatile memory system comprising:
an array of charge storage memory cells;
a reading circuit that is configured to read a plurality of data bits from a portion of the array of charge storage memory cells;
an Error Correction Code (ECC) circuit that is configured to receive the plurality of data bits from the reading circuit and to identify a number of bad bits in the plurality of data bits; and
a data retouching circuit that is configured to increase threshold voltages of charge storage memory cells containing bad bits, using programming pulses that are smaller than normal programming pulses used in programming erased cells, without erasing the charge storage memory cells, until the number of bad bits identified by the ECC circuit drops below a threshold number.

14. The nonvolatile memory system of claim 13 wherein the data retouching circuit is configured to increase threshold voltages of all memory cells in the portion of the memory array that are not in the erased state.

15. The nonvolatile memory system of claim 13 wherein the data retouching circuit is configured to increase threshold voltages of charge storage memory cells using programming pulses that are smaller in amplitude than normal programming pulses used in programming erased cells.

16. The nonvolatile memory system of claim 13 wherein the reading circuit is configured to read the plurality of bits using a read voltage that is different to a default read voltage that is used in a read operation in response to a host read command.

17. The nonvolatile memory system of claim 13 wherein the array of charge storage memory cells is a Multi Level Cell (MLC) array with each memory cell storing two or more bits of data.

18. The nonvolatile memory system of claim 13 further comprising a data programming circuit that programs new data to an erased portion of the array of charge storage memory cells using voltage pulses of a higher voltage than voltage pulses used by the data retouching circuit.

19. A method of operating a nonvolatile memory array comprising:
programming a plurality of memory cells with data;
subsequently maintaining the data in the plurality of memory cells over a period of operation of the nonvolatile memory array; and
subsequently applying a cell retouching operation to increase threshold voltages of memory cells, without erasing the plurality of memory cells, the cell retouching operation comprising one or more cycles, each cycle comprising:
reading the plurality of memory cells;
subsequently applying Error Correction Code (ECC) decoding of data read from the plurality of memory cells to identify bad bits;
subsequently comparing a number of bad bits found from the ECC decoding with a threshold number to determine if retouching is complete;
if the number of bad bits found from the ECC decoding exceeds the threshold number, then applying a retouch voltage pulse that is smaller in amplitude and/or width than a programming voltage pulse to a subset of the plurality of memory cells.

20. The method of claim 19 wherein the subset of the plurality of memory cells consists of all memory cells with threshold voltages in a predetermined threshold voltage range.

21. The method of claim 20 wherein the predetermined threshold voltage range corresponds to one or more programmed memory states.

22. The method of claim 19 wherein cell retouching is triggered by: an elapsed period of time since the programming of the plurality of memory cells with data, a number of access operations directed to a block containing the plurality of memory cells, or a number of errors found in other data stored in the block containing the plurality of memory cells.

* * * * *